United States Patent [19]

Nakayama et al.

[11] Patent Number: 4,531,065
[45] Date of Patent: Jul. 23, 1985

[54] CURRENT INJECTION TYPE LOGICAL OPERATION CIRCUIT ARRANGEMENT INCLUDING A I²L CIRCUIT DEVICE COMPRISING I²L ELEMENTS

[75] Inventors: Koichi Nakayama, Saitama; Yoshito Tanaka, Kawagoe, both of Japan

[73] Assignee: Toko, Inc., Tokyo, Japan

[21] Appl. No.: 402,566

[22] Filed: Jul. 28, 1982

[30] Foreign Application Priority Data

Jul. 29, 1981 [JP] Japan .................. 56-118685
Aug. 3, 1981 [JP] Japan .................. 56-121724
Jun. 18, 1982 [JP] Japan .................. 57-92194[U]

[51] Int. Cl.³ .................. H03K 19/003; H03K 19/091
[52] U.S. Cl. .................. 307/200 A; 307/238.3; 307/442; 307/477; 307/247 A; 365/229
[58] Field of Search .................. 307/66, 200 A, 238.3, 307/442, 459, 477, 247 A; 365/228, 229

[56] References Cited

U.S. PATENT DOCUMENTS

| | | | |
|---|---|---|---|
| 3,562,555 | 2/1971 | Ahrons | 307/200 A |
| 4,085,341 | 4/1978 | Reinert | 307/459 X |
| 4,209,710 | 6/1980 | Quarton | 307/66 |
| 4,227,257 | 10/1980 | Sato | 365/229 X |
| 4,422,163 | 12/1983 | Oldenkamp | 365/229 |
| 4,438,353 | 3/1984 | Sano et al. | 307/459 X |
| 4,449,206 | 5/1984 | Tokitsu et al. | 365/229 |

FOREIGN PATENT DOCUMENTS 65926 4/1982 Japan .................. 307/297

OTHER PUBLICATIONS

Winslow, "Battery Back-Up Power Supply", *IBM Tech. Discl. Bull.;* vol. 23, No. 3, pp. 1240–1241, 8/1980.

*Primary Examiner*—Larry N. Anagnos

[57] ABSTRACT

A I²L circuit device including logical operation circuits comprising I²L elements, wherein when main power supply is interrupted, an injector current is injected from an auxiliary current source circuit into part of the I²L circuit device to thereby hold a logical value, so that when the main power supply is restored, the logical state having been prevailing prior to the interruption of the main power supply is restored. When applied to a drive circuit for a switch including a self-restore type contact, for example, this I²L circuit device is operative such that the switch is set to a predetermined logical value; the logical value is stored in a storage circuit of the I²L circuit device; and when the main power supply is interrupted, an injector current is injected from the auxiliary current source circuit into the storage circuit to thereby hold the stored logical value so that when the main power supply is restored, the logical value having been prevailing prior to the interruption of the main power supply is also restored.

6 Claims, 8 Drawing Figures

CURRENT INJECTION TYPE LOGICAL OPERATION CIRCUIT ARRANGEMENT INCLUDING A I²L CIRCUIT DEVICE COMPRISING I²L ELEMENTS

BACKGROUND OF THE INVENTION

FIELD OF THE INVENTION

This invention relates to a current injection type logical operation circuit arrangement comprising I²L elements.

In some applications wherein a logical operation circuit is employed, it is required that a logical value be held when main power supply is interrupted due to accident, failure, erroneous manipulation or the like. In a drive circuit for a switch including a self-restore type contact, for example, when the main power supply is interrupted for one reason or another after the switch has been set to a predetermined logical value having been set prior to the interruption of the main power supply be restored when the main power supply is restored. More specifically, in the case of a switch including a self-restore type contact, the contact thereof is in an open state after the switch has been set; thus, it is necessary to store the set state by means of a drive circuit for the switch. Usually, when the main power supply is interrupted, the logical value should be held by supplying power to all the circuit devices. In the case where the logical operation circuit comprises MOS transistors, due to low current consumption, it has been the practice that power is supplied from an auxiliary current source circuit to all the logical operation circuits. In the case of I²L circuit, however, since each element thereof requires an injector current as high as 5μA to 10μA, relatively high current consumption is caused therein; thus, difficulties are encountered in an attempt to supply a current to all the logical operation circuits when each of the logical operation circuits is constituted by a I²L circuit. In contrast thereto, when a I²L circuit is in a static state, it is possible to hold a logical value by an injector current as low as 0.5 μA. In view of this fact, the inventors have achieved a novel and improved I²L circuit device which is so designed that current consumption is minimized by supplying an injector current only to such a portion of the I²L circuit as holding circuit or memory circuit.

SUMMARY OF THE INVENTION

It is an object of the present invention to provide a I²L circuit device for logical operation circuit comprising I²L elements, which comprises an auxiliary current source circuit adapted, when main power supply is interrupted, to inject an injector current into such a portion of the I²L circuit as holding circuit or memory circuit to thereby hold the logical value having been prevailing in that portion so that the logical state having been prevailing prior to the interruption of the main power supply is restored when the main power supply is restored.

Another object of the present invention is to provide a I²L circuit device for use with a drive circuit for a switch including a self-restore type contact, wherein when main power supply is interrupted, an injector current is injected from an auxiliary current source circuit in a portion of the I²L circuit so that the condition having been set prior to the interruption of the main power supply is stored; and when the main power supply is restored, the switch drive circuit is returned to the logical state having been prevailing prior to the interruption of the main power supply.

To achieve the foregoing objects, in accordance with the present invention, there is provided a I²L circuit device for setting a predetermined logical value by means for generating a control signal, comprising:

a current source circuit for injecting injector current into said I²L circuit device; and an auxiliary current source circuit for injecting injector current into part of I²L circuits incorporated in said I²L circuit device, wherein when main power supply is interrupted after the predetermined logical value has been set, injector current is injected from said auxiliary current source circuit into said part of the I²L circuits to thereby hold the logical condition, so that when the main power supply is restored, the logical value having been set prior to the interruption of the main power supply is restored.

DESCRIPTION OF THE PREFERRED EMBODIMENTS

Figure 1:
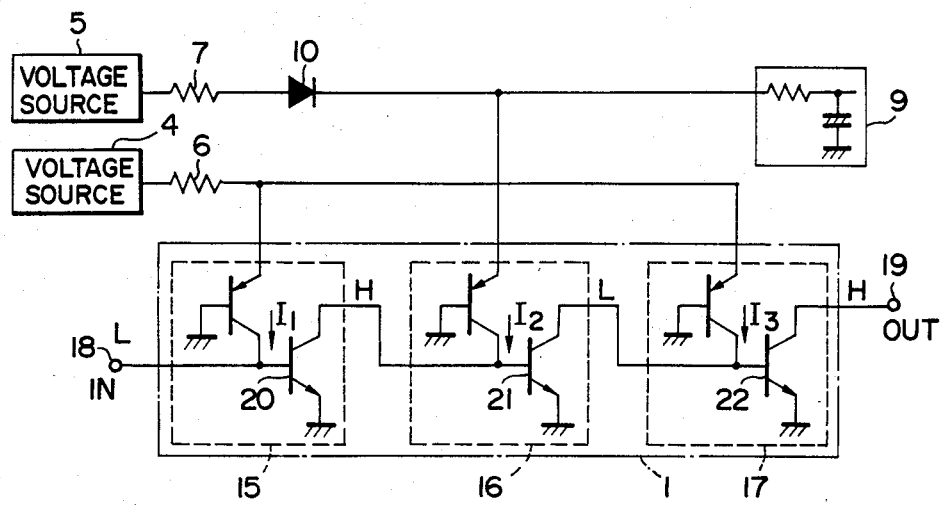
FIGS. 1 and 2 are circuit diagrams useful for explaining the outline of the I²L circuit device embodying the present invention, respectively.

Description will now be made of the I²L circuit device including an auxiliary current source circuit according to the present invention. In the drawings, similar parts are indicated by like reference numerals and characters.

Referring to FIG. 1, there is schematically shown the I²L circuit device including an auxiliary current source circuit according to the present invention, wherein the I²L circuit device is shown as comprising I²L elements 15, 16 and 17. Indicated at 4 and 5 are voltage sources derived from a common power source, respectively, denoted at 6 and 7 are resistors, respectively and shown at 9 is an auxiliary current source circuit. Each of the I²L elements 15 and 17 is supplied with an injector current from a current source circuit comprising the voltage source 4 and resistor 6, and the I²L element 16 is supplied with an injector current either from a current source circuit comprising the voltage source 5 and resistor 7 or from the auxiliary current source circuit 9. Let it now be assumed that a predetermined signal is passed from a terminal 18 to the I²L circuit device 1, with the input terminal 18 being set at L (Low) level and an output terminal 19 at H (High) level. Then, an injector current $I_1$ of the I²L element 15 is absorbed by an external circuit so that a transistor 20 is turned off; thus, the output of the I²L element 15 assumes H level. Since the transistor 20 is in the off sate, the injector current $I_2$ of the I²L element 16 is caused to flow in a transistor 21 so that the latter is turned on so as to draw in a collector current $I_3$ from the I²L element 17. As a result, a transistor 22 is turned off so that the output terminal 19 is caused to assume H level. In this way, a logical state is established.

When the main power source is interrupted and hence the voltage sources 4 and 5 are cut off, no injector current is supplied to the I²L elements 15 and 17, whereas a discharge current available from the auxiliary current source circuit 9 is supplied as injector current to the I²L element 16 so that the latter holds the logical state having been prevailing prior to the interruption of the main power source. That is, the I²L element 16 functions as memory circuit or holding circuit irrespective of the interruption of the main power source. Thus, when the main power is restored, the logical values of the I²L elements 15 and 17 disposed before and after the I²L element 16 are set based on the logical state of the I²L element 16.

The voltage sources 4 and 5 share the common main power source, and the voltage source 5 is supplied, through a resistor 7 and diode 10, to the auxiliary current source circuit 9 which may comprise a charge-discharge circuit formed of a resistor and capacitor. In this case, it is required that the I²L element holding the logical value by having an injector current injected thereinto from the auxiliary current surce circuit 9 when the main power supply is interrupted have H level input and L level output.

Figure 2:
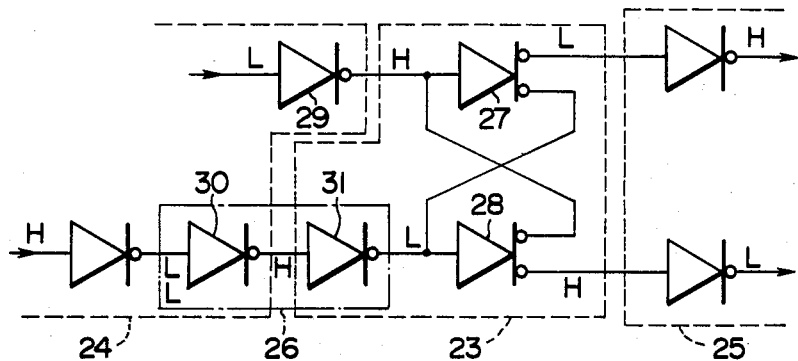

Turning now to FIG. 2, there is shown another embodiment of the present invention, wherein the I²L circuit comprises three blocks 23, 24 and 25. The block 23 and the blocks 24 and 25 are supplied with an injector current from separate voltage sources. When the main power supply is interrupted, the block 23 is supplied with an injector current from the auxiliary current source so that the logical value in the block 23 is stored. I²L elements 27 and 28 incorporated in the block 23 constitute a flip-flop (F/F). The input terminal of the I²L element 27 is set at H level through a I²L element 29, while the input terminal of the I²L element 28 is set at L level. In order that the input level of the I²L element 28 may be stored as L level, a block 26 comprising two I²L elements 30 and 31 is connected to the input state thereof, and the level at the input stage of the I²L element 31 is set at H level. When the main power supply is interrupted, an injector current is injected from the auxiliary current source circuit 9 into the I²L elements 27, 28 and 31 of the block 23 so that these elements hold their logical values. When the main power supply is restored, the logical state having been prevailing prior to the interruption of the main power supply is restored based on the logical values stored in the block 23. Needless to say, when the main power supply is interrupted, the injection of the injector current into the blocks 24 and 25 is also interrupted.

In order to hold the stored logical value by injecting an injector current from the auxiliary current source circuit into the block 23 when the main power supply is interrupted, a block 26 is added so that the input stage of the block 23 is set at H level, since if the input stage of the block 23 were set at L level, then an injector current would be injected from the auxiliary current source circuit thereinto so that the logical value of the I²L circuit would be reversed. Since the input stage of the I²L element 27 is at H level, there is no need to add a I²L circuit such as the block 26 thereat.

Figure 3:
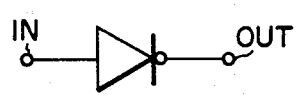
FIG. 3 is a symbolic mark representing a I²L element.
Figure 4:
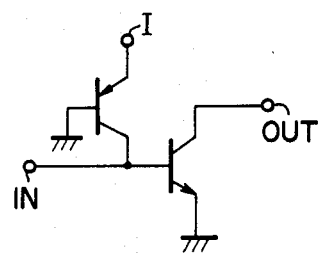
FIG. 4 is a view showing an equivalent circuit of the I²L element.

In FIG. 3, there is shown a symbolic mark representing the I²L element, and in FIG. 4, there is illustrated an equivalent circuit of such an element.

Description will now be made of examples wherein the I²L circuit device including an auxiliary current source circuit according to the present invention has been actually applied.

Figure 5:
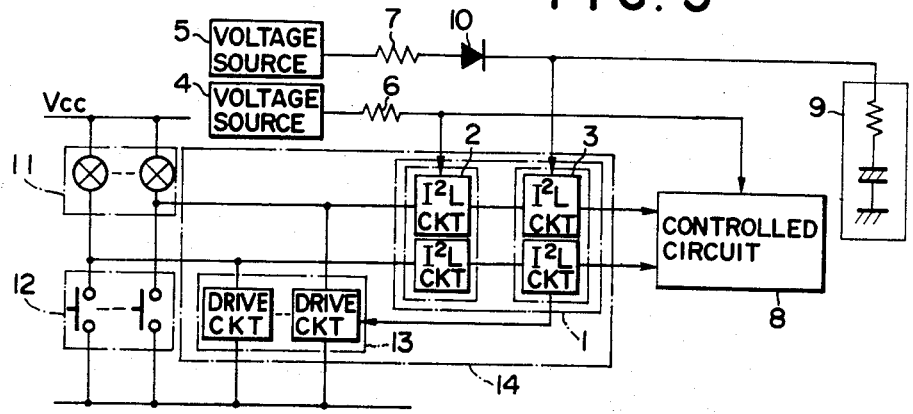
FIG. 5 is a block diagram illustrating a switch drive circuit employing the I²L circuit device including an auxiliary current source circuit according to the present invention.

FIG. 5 is a block diagram showing a switch drive circuit to which the I²L circuit device embodying the present invention is applied, wherein the reference numeral 1 represents the I²L circuit device used as the switch drive circuit, which includes input stage I²L circuits 2 and I²L circuits 3 each arranged to serve as a storage circuit or holding circuit. Indicated at 4 and 5 are separate voltage sources sharing a common main power source, respectively. An injector current is supplied from the voltage source 4 through a resistor 6 to I²L circuits 2 and a controlled circuit 8. An injector current is supplied from the voltage source 5 through a resistor 7 and diode 10 to the I²L circuit 3 serving as storage circuit, and a charge current is supplied therefrom to the auxiliary current source circuit 9. Indicated at 11 is a display light unit comprising a plurality of light emission diodes; shown at 12 is a push-button switch including self-restore type contacts and which is connected in series with the light emission diodes; and denoted at 13 is a drive circuit for holding the display light unit in a lighted state, the drive circuit being connected in parallel with the push-button switch. When any of the contacts of the switch 12 is closed, the corresponding display light is lighted. At the same time, the actuation of the switch 12 is detected by the input stage I²L circuit 2, and a signal resulting from the detection is passed to the storage circuit 3. Furthermore, the drive circuit 17 is activated to hold the corresponding display light in a lighted state. Indicated at 14 is a switch drive circuit. The auxiliary current source circuit 9 comprises a resistor and capacitor.

If the main power supply is interrupted after the switch 12 is closed, then the lighted display light 11 will be turned off, and at the same time, the voltage sources 4 and 5 will also be cut off so that the injection of the injector current into the I²L circuits 2 and 8 will be interrupted, while a discharge current will be supplied from the auxiliary current source circuit 9 to the memory circuit 3 so that the logical condition having been prevailing prior to the interruption of the main power supply will be held in the memory circuit. In this way, after the main power supply is restored, the logical condition having been prevailing prior to the interruption of the main power supply will be restored. The diode 10 prevents the injector current from flowing through the resistor 7.

Figure 7:
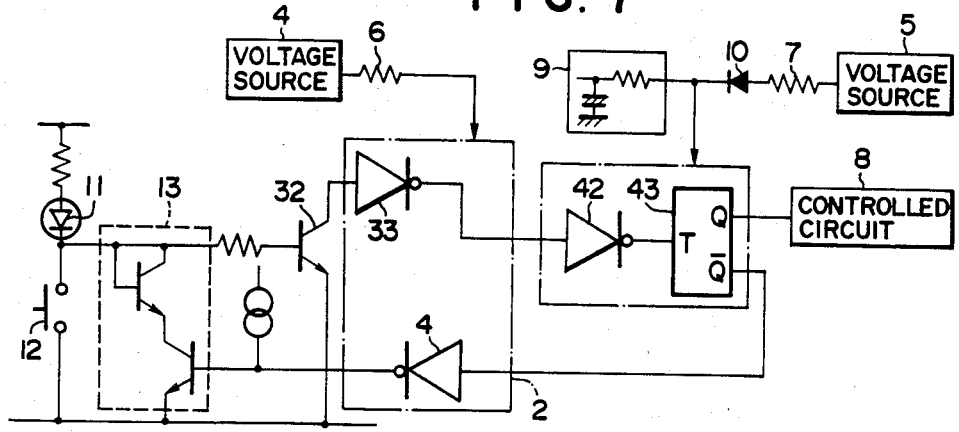
FIGS. 6, 7 and 8 are circuit diagrams showing examples of the switch drive circuit employing the I²L circuit device embodying the present invention, respectively.
Figure 8:
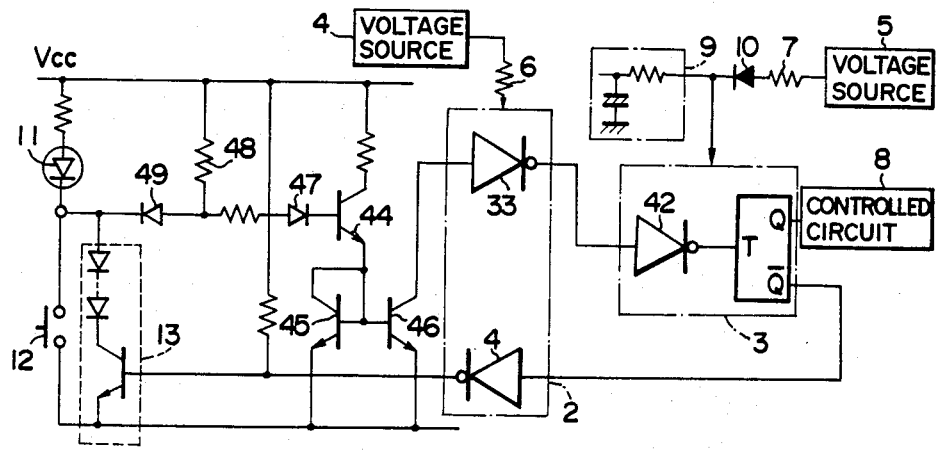
Figure 6:
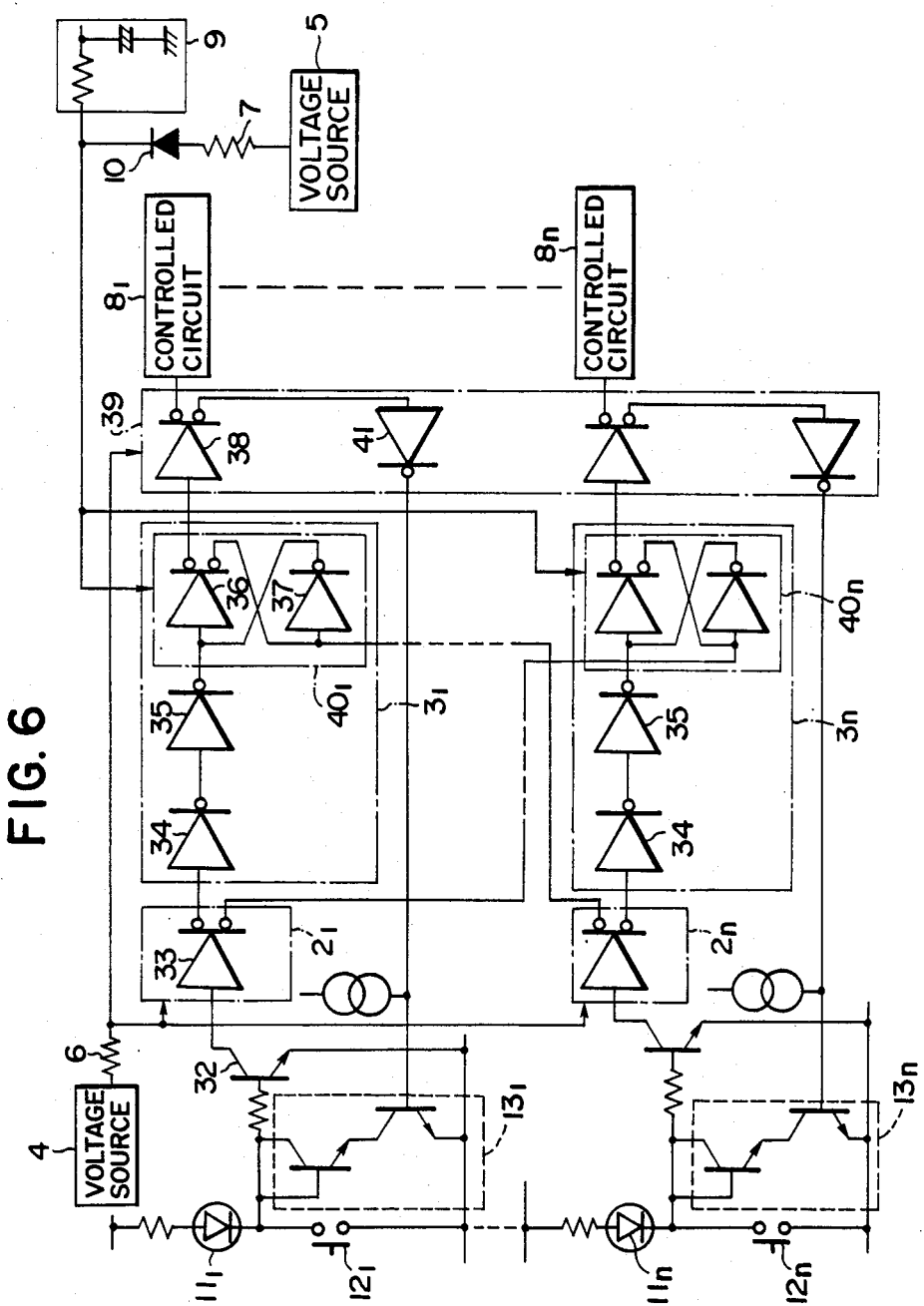

Referring to FIGS. 6 to 8, there are shown other examples wherein the I²L circuit device according to the Present invention is applied to a switch drive circuit.

FIG. 6 shows a concrete example of the block diagram shown in FIG. 5, wherein light emission diodes $11_1$ to $11_n$ and switches $12_1$ to $12_n$ each including a self-restore type contact are arranged in such a manner as to constitute pairs. By turning on the switch $12_1$, the light emission diode 11 will be turned on, and at the same time, a transistor 32, which is conducting, will be turned off, so that the level at the input terminal of the I²L element 33 will be changed from L level to H level while the level at the output terminal thereof will be L level. The resultant signal will be passed to the I²L elements 34 and 35, and a signal of L level will be inputted to a flip-flop $40_1$ which comprises I²L elements 36 and 37. Thus, the level at the output terminal of the I²L 36 will become H level, whereas the level at the output terminal of the I$^2$L element 38 will become L level. In this way, a signal will be passed to a controlled circuit $8_1$, and the signal will also be passed to a drive circuit $13_1$ through a I$^2$L element 41 so that the light emission diode $11_1$ will be held in a lighted state. At the same time, the transistor 32 will be biased by the drive circuit 13 to be turned on so that the outputs of the I$^2$L elements 33 to 35 will be reversed.

By virtue of the fact that the flip-flop $40_1$ has a latch function, the output of the I$^2$L element 36 will be held at H level. When another switch is turned on, the latch function of the flip-flop $40_1$ will be released, so that the output thereof will be reversed from H level to L level.

Function for memorizing the actuation of the switches $12_1$ to $12_n$ is provided by flip-flops $40_1$ to $40_n$. Thus, when the main power supply is interrupted, the discharge current from the auxiliary current source circuit 9 will be injected into the memory circuit comprising the flip-flop $40_1$ to $40_n$, while all the remaining circuits will be cut off. The input terminals of the flip-flops $40_1$ to $40_n$ will normally be set at H level, except when a signal is transmitted. The logical values in the flip-flops $40_1$ to $40_n$ are stored; thus, when the main power supply is restored, the logical condition having been prevailing prior to the interruption of the main power supply will again be restored. Obviously, injector current may be injected from the auxiliary current source circuit 9 into other I$^2$L circuits as desired.

FIGS. 7 and 8 illustrate examples wherein, like the example shown in FIG. 6, the I$^2$L circuit device is employed as a switch drive circuit. The examples of FIGS. 7 and 8 are different from that of FIG. 6 in that in the latter, the switch drive circuit is arranged to be selectively actuated whereas in the formers, the switch drive circuit is arranged such that individual switches effect ON and OFF operations. Description will now be made of the operation of the switch drive circuit. In FIG. 7, when a switch 12 is turned on, a light emission diode 11 will be lighted. At this time, a transistor 32, which is conducting, will be turned off so that the level at the collector electrode of the transistor 32 will be changed from L level to H level. Consequently, a H level output will be imparted to a T-F/F 43 through I$^2$L elements 33 and 42. The T-F/F 43 is comprised of I$^2$L elements. A H level control signal will be passed to a controlled circuit 8. Furthermore, by making the level at the output terminal of the I$^2$L element 4 to be H level, the drive circuit 13 will be operated to hold the light emission diode 11 in a lighted state. At the same time, the transistor 32 will be biased by the drive circuit 13 so that the collector output thereof will be reversed to be L level. Since the transistor 32 is conducting except when a signal is transmitted, the collector thereof is set at L level. By turning on the switch 12 with the light emission diode being turned on, a new signal will be inputted to the T-F/F 43 so that the memory thereof will be released and the light emission diode 11 will be turned off. The input terminal of the I$^2$L circuit 43 constituting memory circuit into which an injector current is injected from the auxiliary current source circuit 9 when the main power supply is interrrupted, will be held at H level except when a signal is transmitted.

In the example of FIG. 8, it is possible to effect transmission and interruption of a signal by individual switches as in the example of FIG. 7. More specifically, by turning on a switch 12, a light emission diode 11 will be turned on, and a transistor 44, which is normally conducting, will be turned off; thus, signal transmission will be effected. At the same time, transistors 45 and 46 which constitute a current mirror circuit will also be turned off. Thus, the level at the input terminal of a I$^2$L element 33 will be reversed from L level to H level so that signal transmission will be effected. Other aspects of the operation of this example are similar to those of the example shown in FIG. 7, and therefore an explanation thereof will be omitted. A diode 47 is provided to prevent a current from flowing out into an external circuit, and a diode 49 is provided to prevent the light emission diode driving current from flowing in the circuit.

As described above, the I$^2$L circuit device according to the present invention is provided with an auxiliary current source circuit which is so designed as to inject an injector current into memory circuit or holding circuit of the I$^2$L circuit device when main power supply is interrupted, whereby the logical condition having been prevailing prior to the interruption of the main power supply is restored when the main power supply is restored. Further, the input terminal of the memory circuit or holding circuit comprising I$^2$L circuits is set at H level except during singal transmission. It is important that I$^2$L element into which injector current is injected be made operable; hence, the input terminal of such I$^2$L element is set at H level while the output terminal thereof is set at L level. Furthermore, the injector current injected into the immediately succeeding I$^2$element is drawn in by the immediately preceding I$^2$L element, so that the level ofthe output terminal of the post-stage I$^2$L element becomes H level. In this way, logical conditions are successively set up in accordance with the respective I$^2$L circuits incorporated in the memory circuit.

As will be appreciated from the foregoing discussion, the I$^2$L circuit device including an auxiliary current source circuit according to the present invention is arranged such that when main power supply is interrupted, injector current is injected into part of the I$^2$L circuits so that the logical condition having been prevailing prior to the interruption of the main power supply is held and such logical condition is restored when the main power supply is restored. With such an arrangement, the auxiliary current circuit can be constituted by a charge-discharge circuit with a relatively low capacity. Injector current to be supplied to a I$^2$L element when such an element is in a static state may be 1/20 to 1/10 as low as that to be supplied when the element is in a dynamic state. Thus, it is possible to hold logical condition with such a low injector current when the element is in a static state. From this fact, too, it will be seen that the charge-discharge circuit constituting the auxiliary current source circuit may be constructed as one having a low capacitance to advantage. Another advantage is that the present device can be manufactured at a low cost since the I$^2$L circuits and transistors incorporated therein can be formed by a bipolar process which faciliates formation of semiconductor integrated circuits. Although in the foregoing embodiments, the auxiliary current source circuit was constituted by a charge-discharge circuit comprising a resistor and capacitor, it is to be understood that the present invention is by no means limited thereto and that the auxiliary current source circuit may take any other suitable form of construction.

Furthermore, although the I$^2$L circuit device according to the present invention was applied to a switch drive circuit, it will also be appreciated that the present device is equally applicable to other types of logical operation circuit.

What is claimed is:

1. A I$^2$L circuit device for setting a predetermined logical value, which includes means for generating a control signal, said device comprising:
   a first and a second current source circuit for injecting injector current into said I$^2$L circuit device; and
   an auxiliary current source circuit connected to said second current source circuit for injecting injector current into a I$^2$L element of said I$^2$L circuit device, wherein when main power supply is interrupted after the predetermined logical value has been set, injector current is injected from said auxiliary current source into said I$^2$L element to thereby hold the logical condition, so that when the main power supply is restored, the logical value having been set prior to the interruption of the main power supply is restored.

2. A I$^2$L circuit device including an auxiliary current circuit as set forth in claim 1, wherein said auxiliary current source circuit is constituted by a charge-discharge circuit comprising a resistor and capacitor, said auxiliary current source circuit being connected to a voltage source through a resistor and diode, and the connection point between said auxiliary current source circuit and said diode is connected to the injector terminal of said I$^2$L element which is to hold the logical value when the main power supply is interrupted.

3. A I$^2$L circuit device including an auxiliary current source circuit as set forth in claim 1, wherein injector current is injected from said auxiliary current source into a I$^2$L element so that the input and output of said I$^2$L element may be set at H level and L level respectively, whereby when the main power supply is restored, the I$^2$L circuit device is returned to the logical condition having been prevailing prior to the interruption of the main power supply.

4. A I$^2$L circuit device as set forth in claim 1, wherein said control signal generating means comprises switch means each of which includes, in pair, a switch having a self-restore type contact and a display light for displaying the actuation of the associated switch; said I$^2$L circuit device is employed as a switch drive circuit for said switches, said I$^2$L circuit device including I$^2$L elements for memorizing the actuation of the associated switches; and when one of the switches is actuated, the I$^2$ elements associated with the other switches are reset.

5. A current injection type logical operation circuit arrangement including a I$^2$L circuit device comprising I$^2$L elements, comprising:
   a first and a second current source;
   an auxiliary current source circuit;
   a switch mechanism including, in pairs, self-restore type switch contacts and display lights; and
   a switch drive circuit constituted by said I$^2$L circuit device, said switch drive circuit being responsive to the actuation of any of said switch contacts to provide a command signal and turn on that one of said display lights which is paired with the actuated switch contact, said switch drive circuit including memory circuits and flip-flop circuits which include the I$^2$L elements, said memory circuits being arranged to store signals derived in response to command signals resulting from the opening and closing of said switch contacts;
   said first and second current sources for injecting are arranged to inject injector currents into said memory circuits and flip-flop circuits of said I$^2$L circuit device, wherein injector current is injected from said first current source into said memory circuits and a charge current is normally supplied from said first current source to the auxiliary current source circuit; when main power supply is interrupted, injector current is injected from said auxiliary current source circuit into said memory circuits so that logical values stored therein are held; and when the main power supply is restored, the logical condition having been prevailing prior to the interruption of the main power supply is restored based on the logical values stored in said memory circuits.

6. A current injection type logical operation circuit arrangement including a I$^2$L circuit device comprising I$^2$L elements as set forth in claim 5, further comprising a plurality of arrays of said switch mechanisms and said switch drive circuits; and a selector circuit, when the switch in any of said plurality of arrays is actuated, for enabling a command signal resulting from the actuation of said switch to be held in the memory circuit in the same array and also for transmitting a signal to the memory circuits in the other arrays, thereby releasing the logical condition having been prevailing prior to the interruption of the main power supply.

* * * * *